(12) United States Patent
Sato

(10) Patent No.: US 11,624,649 B2
(45) Date of Patent: Apr. 11, 2023

(54) DISPLAY DEVICE AND INERTIAL MEASUREMENT SYSTEM

(71) Applicant: Seiko Epson Corporation, Toyko (JP)

(72) Inventor: Kenta Sato, Shiojiri (JP)

(73) Assignee: SEIKO EPSON CORPORATION

( * ) Notice: Subject to any disclaimer, the term of this patent is extended or adjusted under 35 U.S.C. 154(b) by 53 days.

(21) Appl. No.: 17/238,268

(22) Filed: Apr. 23, 2021

(65) Prior Publication Data

US 2021/0333147 A1    Oct. 28, 2021

(30) Foreign Application Priority Data

Apr. 24, 2020  (JP) .............................. JP2020-077200

(51) Int. Cl.
   *G01H 11/06*     (2006.01)
   *G01R 13/02*     (2006.01)

(52) U.S. Cl.
   CPC ........... *G01H 11/06* (2013.01); *G01R 13/029* (2013.01); *G01R 13/0281* (2013.01)

(58) Field of Classification Search
   CPC ...................................................... G01H 11/06
   See application file for complete search history.

(56) References Cited

U.S. PATENT DOCUMENTS

| 5,315,874 | A | * | 5/1994 | Petrovich ............ G01P 15/0802 73/488 |
| 2008/0260167 | A1 | | 10/2008 | Kim et al. |
| 2016/0300341 | A1 | * | 10/2016 | Hay ...................... G06K 9/0053 |
| 2019/0339119 | A1 | * | 11/2019 | Tamatsukuri .......... G01H 11/06 |

FOREIGN PATENT DOCUMENTS

| JP | H04-290930 A | 10/1992 |
| JP | H10-221160 A | 8/1998 |
| JP | H11-326033 A | 11/1999 |
| JP | 2008-268176 A | 11/2008 |

* cited by examiner

*Primary Examiner* — Toan M Le
*Assistant Examiner* — Xiuqin Sun
(74) *Attorney, Agent, or Firm* — Harness, Dickey & Pierce, P.L.C.

(57) ABSTRACT

An inertial measurement system includes three acceleration sensors detecting along three orthogonal axes, a display having several display areas, and a processor programed to perform a process. The processor calculates frequencies and spectral intensities of vibrations based on detected time series accelerations by three acceleration sensors and obtains relationship values between the calculated frequencies and the calculated spectral intensities. The processor causes the display to successively display an N-th value, intermediate values, and an (N+1)-th value of the relationship values at one display area in time series.

7 Claims, 6 Drawing Sheets

DISPLAY DEVICE AND INERTIAL MEASUREMENT SYSTEM

The present application is based on, and claims priority from JP Application Serial Number 2020-077200, filed Apr. 24, 2020, the disclosure of which is hereby incorporated by reference herein in its entirety.

BACKGROUND

1. Technical Field

The present disclosure relates to a display device and an inertial measurement system.

2. Related Art

Recently, against the background of increased efficiency of production processes due to labor shortages, and increased precision of manufacturing devices, it is desired to simplify a measurement system monitoring the state of a device or measuring an ambient vibration, ambient temperature or the like. For example, JP-A-10-221160 discloses an integrity testing device that carries out an integrity test with an analysis device, based on vibration waveform data measured by a plurality of sensors, and that outputs or displays the result of the test in the form of an image or a print. This integrity testing device also outputs or displays the result of analysis of power spectral density function (PSD) by the analysis device, in the form of a numeric value, bar chart, contour graph, three-dimensional line graph or the like.

However, the integrity testing device disclosed in JP-A-10-221160 simultaneously displays the results of analyzing a plurality of vibration data. Therefore, it is not easy to determine the results of the analysis. Particularly, when a plurality of results of analysis are simultaneously displayed in a contour graph or three-dimensional line graph and the behavior is complicated, each of the results is not very visible and is difficult to analyze, posing a problem in that the trend in relation to the elapsed time is hard to determine.

SUMMARY

A display device includes a display unit displaying a first two-dimensional display showing a frequency and a spectral intensity of a vibration at the frequency. In the first two-dimensional display, at least one measurement value of a first measurement value in a first direction, a second measurement value in a second direction orthogonal to the first direction, and a third measurement value in a third direction orthogonal to the first direction and the second direction, and a composite value of the first measurement value, the second measurement value, and the third measurement value, are displayed as superimposed on each other. As each of the at least one measurement value and the composite value, an N-th measurement value corresponding to an N-th time, an (N+1)th measurement value corresponding to an (N+1)th time, and m−1 intermediate values generated between the N-th measurement value and the (N+1)th measurement value by dividing a period between the N-th time and the (N+1)th time into m parts, are successively displayed in order of the N-th measurement value, the intermediate value, and the (N+1)th measurement value.

An inertial measurement system includes: the foregoing display device; and an inertial measurement device measuring inertia in the first direction, the second direction, and the third direction.

DESCRIPTION OF EXEMPLARY EMBODIMENTS

Embodiment

A schematic configuration of an inertial measurement system 1 according to this embodiment will now be described.

Figure 1:
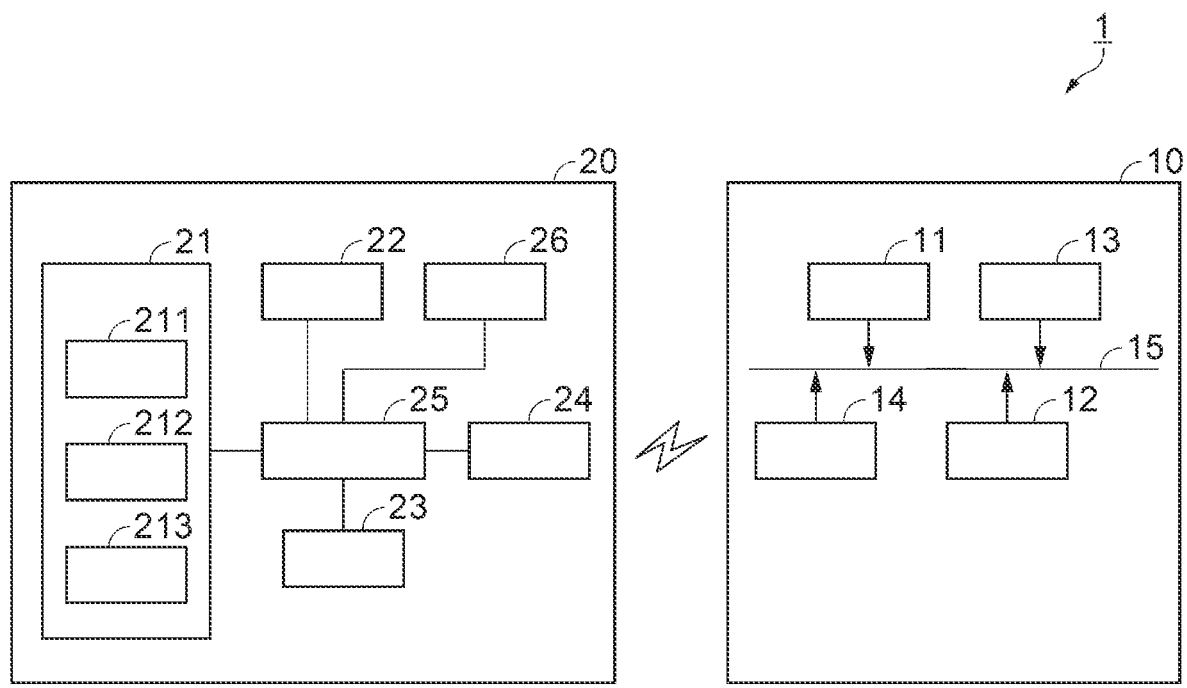
FIG. 1 shows the configuration of an inertial measurement system according to a first embodiment.

As shown in FIG. 1, the inertial measurement system 1 has an inertial measurement device 20 and a personal computer (PC) 10 as a display device. The inertial measurement system 1 measures a vibration of a device or an ambient vibration, using the inertial measurement device 20, and transmits the resulting measurement information such as vibration data to the PC 10. The PC 10 analyzes the measurement information received from the inertial measurement device 20 and the causes a display unit 11 to display the analyzed measurement information. This enables the user to monitor the operating state and ambient state of the device.

First, the inertial measurement device 20 will be described.

The inertial measurement device 20 has a sensor unit 21, an operation unit 22, a memory 23, an interface unit 24, a processing unit 25, and an information display unit 26. The inertial measurement device 20 is an IMU (inertial measurement unit) and is a device measuring inertia in each of an X-axis direction as a first direction, a Y-axis direction as a second direction, and a Z-axis direction as a third direction, where the X-axis, the Y-axis, and the Z-axis are orthogonal to each other.

The operation unit 22, the memory 23, the interface unit 24, the processing unit 25, and the information display unit 26 are provided at a circuit board, not illustrated. The circuit board is, for example, a printed board or rigid board where a metal wiring is formed. In the inertial measurement device 20, the information display unit 26, the circuit board, and the sensor unit 21 are fixed in this order to the top of a base with a columnar fixing member.

The inertial measurement device 20 can be fixed to and installed at a measurement target such as a device, using a double-sided adhesive tape or the like on a surface opposite to the surface of the base where the sensor unit 21 is fixed. This enables the inertial measurement device 20 to be installed at any place such as a lateral surface, sloped surface or outer bottom surface of the device.

The sensor unit 21 has a physical quantity sensor measuring a physical quantity.

As shown in FIG. 1, the sensor unit 21 has a first sensor 211, which is an acceleration sensor measuring an acceleration in the first direction, a second sensor 212, which is an acceleration sensor measuring an acceleration in the second direction, and a third sensor 213, which is an acceleration sensor measuring an acceleration in the third direction. Thus, the sensor unit 21 can measure an acceleration in each of the X-axis direction, the Y-axis direction, and the Z-axis direction. In the description below, the first sensor 211, the second sensor 212, and the third sensor 213 may also be referred to as "the sensors 211 to 213". As the sensors 211 to 213, quartz crystal acceleration sensors or the like are used.

The physical quantity sensor is not limited to an acceleration sensor and may be any sensor that can measure information about inertia by a certain measurement technique. For example, the physical quantity sensor may be a velocity sensor or angular velocity sensor that can measure a physical quantity such as a velocity or angular velocity.

The sensor unit 21 includes a sensor board where the sensors 211 to 213 are provided, and a case accommodating the sensor board. The case is formed of an electrically conductive member such as a metal. The sensor board is provided in an accommodation space inside the case.

The operation unit 22 is formed of a mode changing switch, a reset switch, a measurement switch and the like. The user operates each switch, thus enabling the inertial measurement device 20 to perform various operations.

The memory 23 is, for example, a non-volatile memory and is implemented, for example, by an EEPROM (electrically erasable programmable read-only memory) that can electrically erase data or an OTP (one-time programmable) memory using a FAMOS (floating-gate avalanche-injection MOS), or the like. The memory 23 is, for example, an SRAM temporarily storing data. The memory 23 can also store a threshold such as measurement reference information for inertial measurement.

The interface unit 24 is a communication interface communicating with outside. For example, the interface unit 24 is a device performing near-field wireless communication based on Bluetooth (trademark registered) and is implemented by a wireless communication IC, which is an integrated circuit device, or the like. The wireless communication is not limited to Bluetooth wireless communication and may be near-field wireless communication based on ZIG-BEE (trademark registered), Wi∞SUN (trademark registered) or the like or may be wireless communication based Wi-Fi (trademark registered) or the like.

The interface unit 24 may perform wired communication based on a UART (universal asynchronous receiver/transmitter), GPIO (general-purpose input/output), or SPI (serial peripheral interface) or the like.

The processing unit 25 performs processing based on measurement information from the sensors 211 to 213 provided in the sensor unit 21. The processing unit 25 is a processing circuit and can be implemented, for example, by a processor such as an MPU or CPU. Alternatively, the processing unit 25 may be implemented by an ASIC (application-specific integrated circuit) based on automatic wire laying of a gate array or the like.

For example, the processing unit 25 is coupled to the sensors 211 to 213 of the sensor unit 21 via a connector or the like. Measurement information from the sensors 211 to 213 is inputted to the processing unit 25 via the connector or the like. The measurement information is, for example, acceleration information or information based on the acceleration information.

The processing unit 25 performs various kinds of processing based on the measurement information from the sensors 211 to 213. For example, the processing unit 25 performs processing to process the measurement information into appropriate information as display information for the information display unit 26. The processing unit 25 performs analysis processing to analyze a vibration, inclination or attitude or the like of a measurement target, based on the measurement information from the sensors 211 to 213. For example, the processing unit 25 performs FFT analysis (fast Fourier transform analysis) as the analysis processing and thus analyzes a frequency component of the measurement information or the like.

The information display unit 26 displays the display information processed by the processing unit 25, based on the measurement information from the sensors 211 to 213 of the sensor unit 21.

For example, when the processing unit 25 performs processing based on the measurement information from the sensors 211 to 213, the information display unit 26 displays display information corresponding to the result of the processing by the processing unit 25.

Also, when the processing unit 25 performs processing to process based on the measurement information from the sensors 211 to 213, the information display unit 26 displays display information corresponding to the processed measurement information.

When the processing unit 25 performs analysis processing based on the measurement information from the sensors 211 to 213, the information display unit 26 displays display information corresponding to the result of the analysis.

The information display unit 26 is a light-emitting element converting an electrical signal into an optical signal and can be implemented by a semiconductor element such as a light-emitting diode (LED). Alternatively, the light-emitting element may be implemented by another element than the semiconductor element. The information display unit 26 may also be a display panel such as an organic EL panel or liquid crystal panel.

The inertial measurement device 20 is also provided with a power-supply interface, not illustrated. The inertial measurement device 20 can thus be supplied with electricity from an external power supply via the power-supply interface. The inertial measurement device 20 is also provided with a battery, not illustrated. The battery can be charged via the power-supply interface.

Such an inertial measurement device 20 can transmit the measurement information from the sensors 211 to 213 of the sensor unit 21 to outside or transmit the display information processed by the processing unit 25 to outside, via the interface unit 24.

The personal computer (PC) 10 as a display device will now be described.

The PC 10 is a general-purpose computer and has a display unit 11, a processing unit 12, a storage unit 13, an interface unit 14, and a bus 15, as shown in FIG. 1.

The PC 10 has the processing unit 12 executing a control program to centrally control each part of the PC 10, the storage unit 13 storing a program executed by the processing unit 12 and data related to the program in a non-volatile manner, the display unit 11 displaying display data of the result of processing by the processing unit 12 or the like, and the interface unit 14 transmitting and receiving data to and from the inertial measurement device 20. These components are coupled to each other via the bus 15.

The interface unit 14 is a communication interface communicating with outside and is a device performing near-field wireless communication based on Bluetooth (trademark registered) or the like. The interface unit 14 is similar to the interface unit 24 and therefore will not be described further in detail.

The interface unit 14 communicates with the interface unit 24 of the inertial measurement device 20 and thus can receive measurement information from the inertial measurement device 20.

The processing unit 12 is a logical operation circuit and performs computational processing to display the measurement information from the inertial measurement device 20, on the display unit 11. As the processing unit 12, for example, at least one type of device from among a central processing unit (CPU), a digital signal processor (DSP), a programmable logic device (PLD), an application-specific integrated circuit (ASIC), and the like, can be used. The processing unit 12 can compute a frequency and a spectral intensity of a vibration at the frequency, using the measurement information from the inertial measurement device 20 received via the interface unit 14.

As the storage unit 13, for example, a semiconductor memory can be used. Also, not only a non-volatile memory but also a volatile memory such as a register or cache memory built in the CPU can be used. The storage unit 13 receives and stores the display information computed by the processing unit 12. The storage unit 13 also has Robin PC Viewer as PC viewer software for causing the display unit 11 to display the computed display information.

The display unit 11 is a monitor for outputting an image signal. The display unit 11 displays display information such as the frequency and the spectral intensity of the vibration at the frequency computed by the processing unit 12.

The functions of the inertial measurement system 1 will now be described.

The inertial measurement device 20 in the inertial measurement system 1 has three measurement functions, that is, real-time measurement, one-time log measurement, and continuous log measurement.

In the real-time measurement, the inertial measurement device 20 can perform a measurement, for example, every second, and cause the display unit 11 to display display information corresponding to measurement information. The display information updated every second makes it easier for the user to immediately grasp a vibration generated at the place where the inertial measurement device 20 is installed, and therefore to grasp the source of the vibration and resonance within the device.

In the one-time log measurement, the inertial measurement device 20 can perform, for example, a 30-second measurement and cause the display unit 11 to display display information corresponding to measurement information. The measurement information is saved in the memory 23. The user can have display information simultaneously displayed corresponding to a plurality of pieces of measurement information saved in the memory 23.

In the one-time log measurement, the measurement time of 30 seconds is longer than in the real-time measurement. Therefore, measurement information can be acquired with a higher accuracy. Also, since a plurality of pieces of display information are simultaneously displayed on the display unit 11, the display information can be compared more easily. For example, comparing ambient vibrations measured at a plurality of measurement positions makes it easier to determine the relocation of the device or the like.

In the continuous log measurement, the inertial measurement device 20 can continuously perform, for example, 30-second measurements, and cause the display unit 11 to display display information corresponding to measurement information every 30 seconds. The measurement information is saved in the memory 23. In the continuous log measurement, highly accurate measurement information can be continuously acquired. The user can have display information displayed in time series on the display unit 11, corresponding to a plurality of pieces of measurement information saved in the memory 23. Therefore, for example, displaying display information corresponding to a long period makes it easier for the user to grasp a vibration change or an abnormal vibration due to the days of the week, time, and the like.

The three measurement functions have been described. However, the place where the measurement information is saved is not limited to the memory 23 and may be the storage unit 13 of the PC 10. Also, the display information corresponding to the measurement information may be processed by either the processing unit 25 or the processing unit 12, provided that the display information is processed as corresponding to each of the display unit 11 and the information display unit 26.

The PC 10 in the inertial measurement system 1 displays display information on the display unit 11.

The display unit 11 displays a PC viewer generated by the above PC viewer software and displays display information in the form of a graph or the like. The display unit 11 also displays a switch function in the form of a button. Giving an instruction with the button enables operation of and measurement by the inertial measurement device 20.

The PC 10 can also receive measurement information measured by the inertial measurement device 20 and automatically generate an Excel file. Moreover, the PC 10 can cause the processing unit 12 to process the measurement information that is automatically generated and saved, and cause the display unit 11 to play back and display the measurement information as display information.

The display information played back and displayed by the display unit 11 will now be described.

Figure 2:
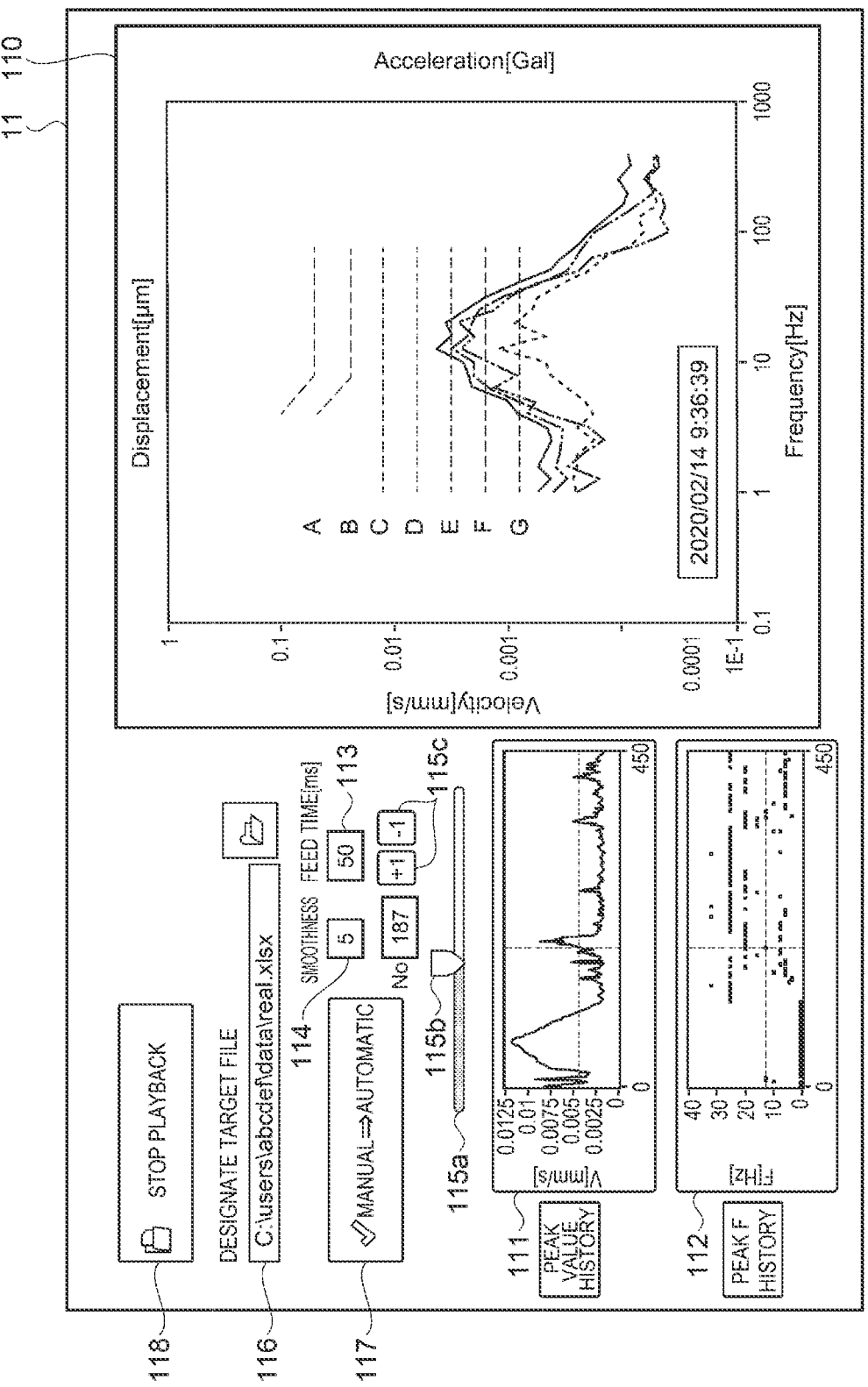
FIG. 2 is a schematic view showing a data playback screen displaying display information on a display unit.

FIG. 2 shows a data playback screen displaying display information on the display unit 11. The data playback screen includes a first display screen 110, a second display screen 111, a third display screen 112, a speed input section 113, a number-of-divisions input section 114, time input sections 115*a*, 115*b*, 115*c*, a file input section 116, a mode change button 117, and a playback button 118.

Figure 3:
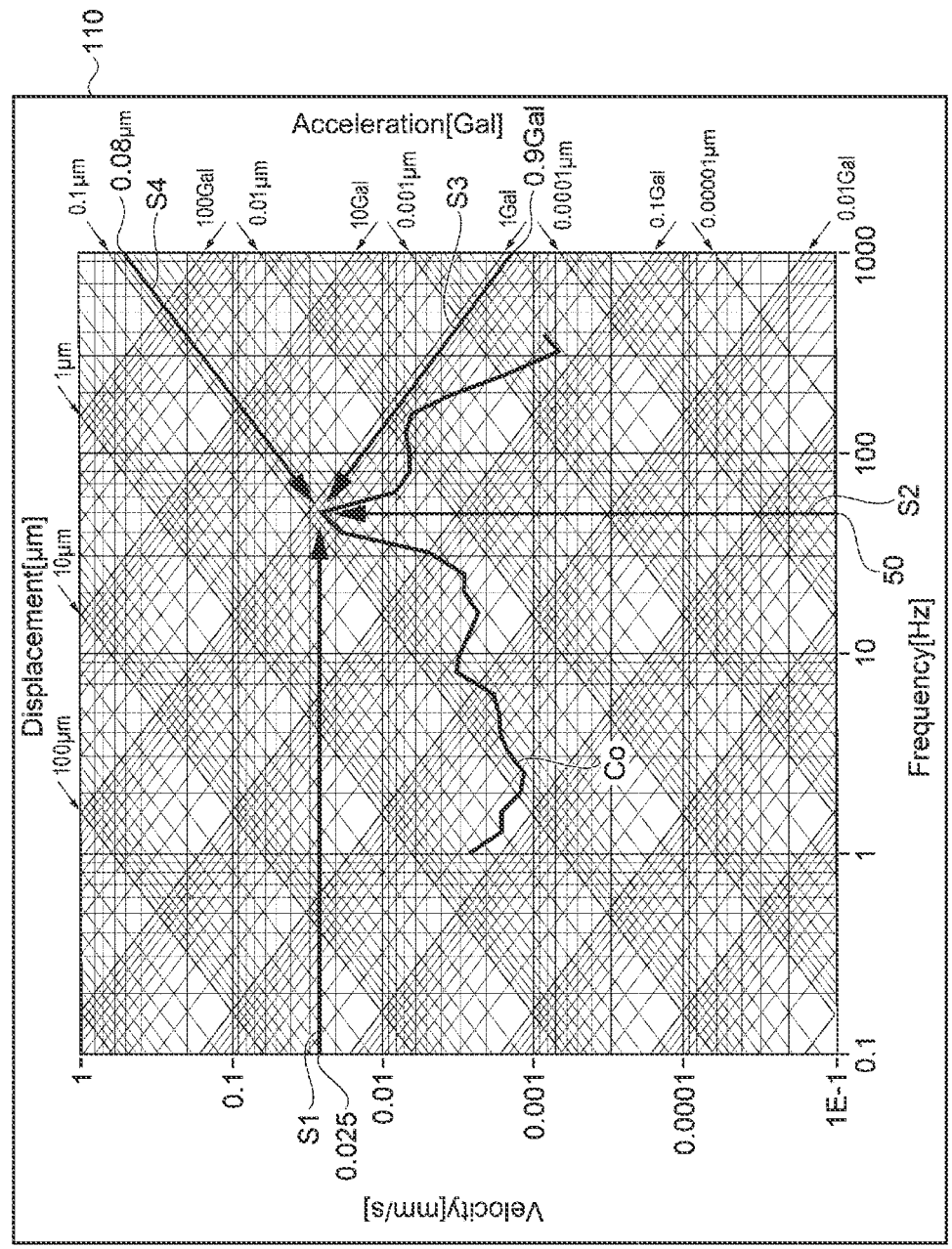
FIG. 3 shows a tripartite graph.

The first display screen 110 as a first two-dimensional display shows a frequency corresponding to measurement information received from the inertial measurement device 20 and the spectral intensity of a vibration at the frequency. Specifically, the first display screen 110 shows a tripartite graph showing frequency, vibration velocity, vibration displacement, and acceleration on four axes. As shown in FIG. 3, in the tripartite graph, the vertical axis represents vibration velocity [mm/s] and the horizontal axis represents frequency [Hz]. In the graph, a line drawn upward to the left represents acceleration [Gal] and a line drawn downward to the left represents vibration displacement [μm].

The tripartite graph enables simultaneous reading of the frequency of vibration, the vibration velocity, the vibration displacement, and the acceleration from a point in the graph without any complicated calculation. For example, it can be seen that, at a maximum peak value of a composite value Co shown in FIG. 3 and described later, the vibration velocity is 0.025 mm/s as indicated by an arrow S1, the frequency is 50 Hz as indicated by an arrow S2, the acceleration is 0.9 Gal as indicated by an arrow S3, and the vibration displacement is 0.08 μm as indicated by an arrow S4. In this way, using the tripartite graph as the first display screen 110 enables the user to simultaneously read a plurality of pieces of information and therefore easily analyze the information.

Figure 4:
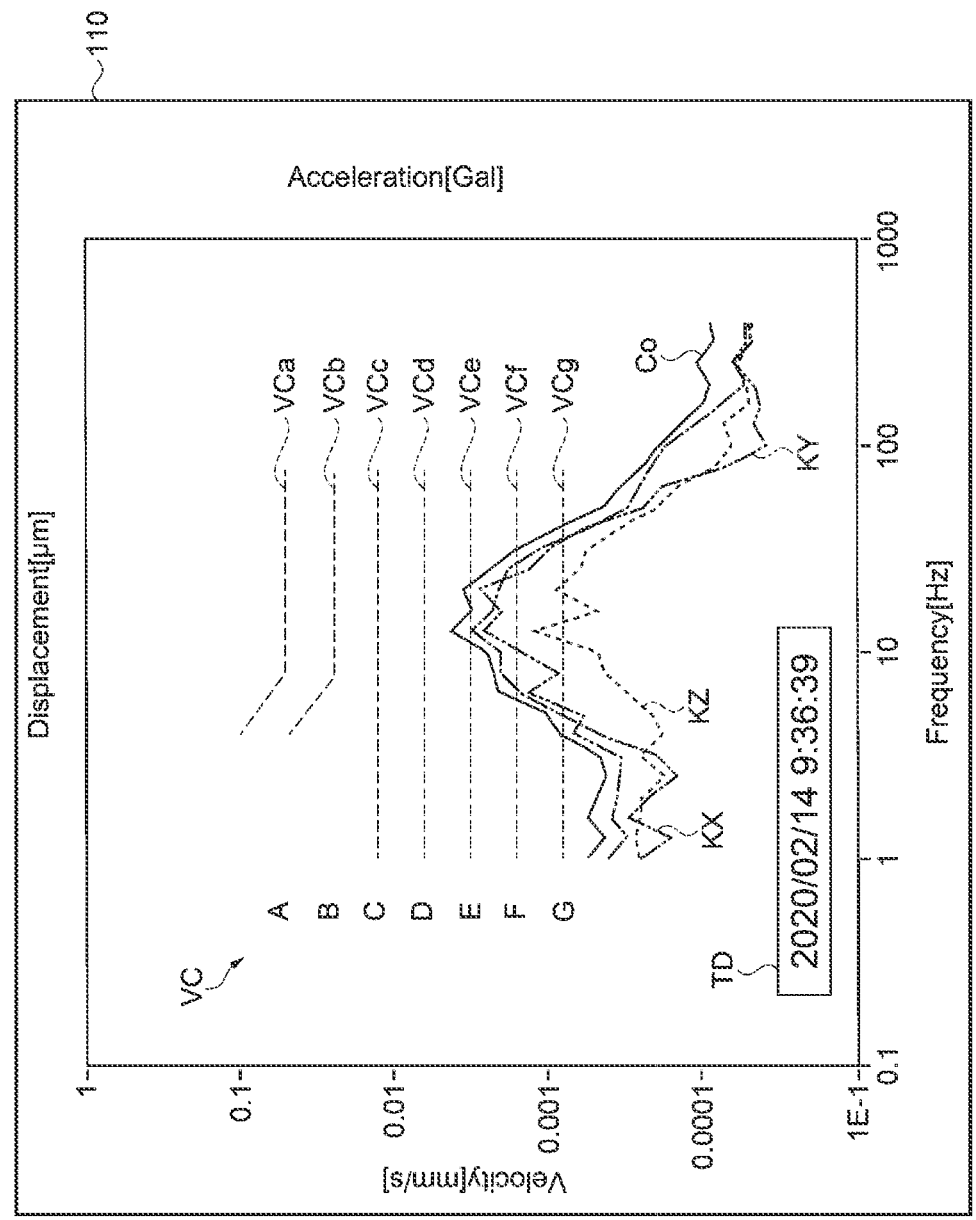
FIG. 4 shows a first display screen.

As shown in FIG. 4, in the first display screen 110, a measurement value KX in a first direction, a measurement value KY in a second direction orthogonal to the first direction, and a measurement value KZ in a third direction orthogonal to the first direction and the second direction, and a composite value Co of the measurement value KX, the measurement value KY, and the measurement value KZ combined together, are displayed as values shown in the tripartite graph.

However, the values shown in the first display screen 110 are not limited to the above values. It suffices that at least one of the three measurement values KX, KY, KZ as well as the composite value Co is displayed.

Also, time TD is displayed in the first display screen 110. The time TD shows the year, month, day, hour, minute, and second when the values shown in the tripartite graph are measured.

Also, in the first display screen 110, a vibration criteria level VC, which represents vibration criteria, is displayed as superimposed on the measurement values KX, KY, KZ and the composite value Co. The vibration criteria level VC represents vibration criteria that are commonly used in vibration measurement. The measured frequency and the vibration criteria level VC are displayed as superimposed on each other in the first display screen 110. Thus, by viewing the first display screen 110, the user can intuitively determine the level of the measured vibration and can easily grasp the vibration environment of the place of measurement.

The vibration criteria are not limited to the above vibration criteria. Other vibration criteria may be displayed in the first display screen 110. Even in this case, similar effects to those of this embodiment can be achieved.

As the vibration criteria level VC, criteria lines VCa to VCg corresponding to VC-A to VC-G levels are shown.

The VC-A level is determined when the maximum peak value of the vibration velocity shown in the graph exceeds the criteria line VCb and does not reach the criteria line VCa. For example, in terms of the composite value Co shown in the graph of FIG. 4, the maximum peak value of the vibration velocity exceeds the criteria line VCe of the VC-E level and does not reach the criteria line VCd of the VC-D level. Therefore, it can be understood that, at the place where the composite value Co is measured, the vibration velocity is the VC-D level and that a precision device such as a scanning electron microscope (SEM) or an electron beam system can be installed at this place.

Displaying the vibration criteria level VC serving as criteria for installation, as superimposed on the tripartite graph in the first display screen 110 in this way, enables easy determination of the vibration criteria level VC of the vibration velocity and thus makes it easier to select a place to install a device or evaluate the place where a device is installed.

In the data playback screen on the display unit 11, display information corresponding to the measurement information in the Excel file saved as described above can be displayed successively in time series. For example, a case of automatically playing back and displaying an Excel file saved in the real-time measurement will now be described.

First, the address of an Excel file is designated in the file input section 116 in the data playback screen and the playback button 118 is selected. Thus, in the first display screen 110, measurement values KX, KY, KZ and a composite value Co corresponding to measurement information saved in the designated Excel file, and an intermediate value generated from the measurement values KX, KY, KZ and the composite value Co, are displayed successively in time series.

The values displayed in the first display screen 110 in the data playback screen will be described, using the measurement value KX as an example.

The measurement value KX is a value corresponding to measurement information measured every second by the real-time measurement and includes an N-th measurement value corresponding to an N-th time and an (N+1)th measurement value corresponding to an (N+1)th time that are measured, such as a first measurement value d1 measured at the first second, which is a first time, a second measurement value d2 measured at the second second, which is a second time, a third measurement value measured at the third second, which is a third time.

Figure 5:
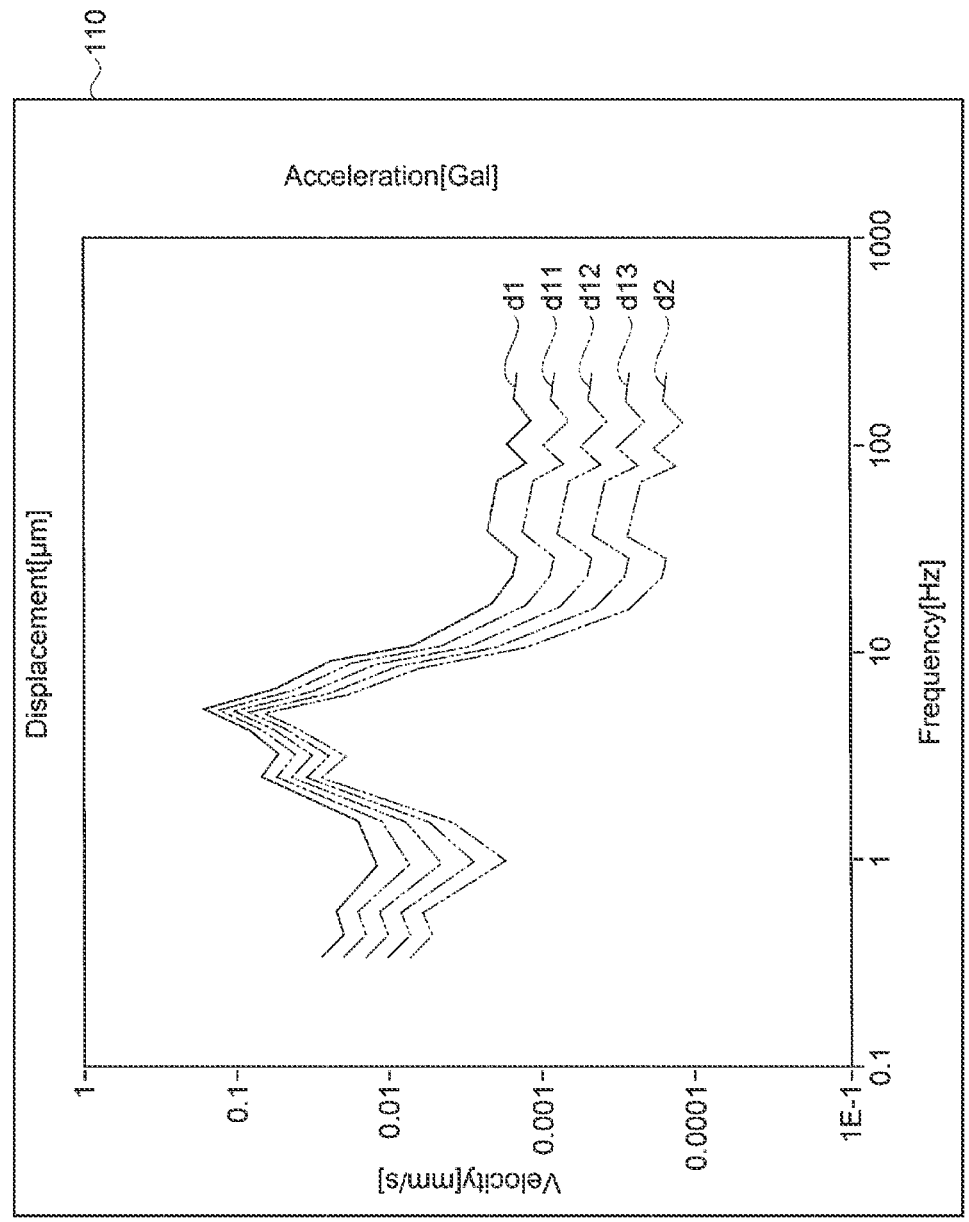
FIG. 5 shows the first display screen where measurement values are successively displayed.

As shown in FIG. 5, of the measurement value KX, the first measurement value d1 measured at the first second, the second measurement value d2 measured at the second second, and three intermediate values d11, d12, d13 generated between the first measurement value d1 and the second measurement value d2 by dividing the period between the first second and the second second by four parts, are displayed in the first display screen 110. In FIG. 5, the five values representing continuous movements are simultaneously shown. However, in the PC viewer, the five values are displayed sequentially. Specifically, the first measurement value d1 is displayed first. Next, the first measurement value d1 disappears and the intermediate value d11 is displayed. Then, the intermediate value d11 disappears and the intermediate value d12 is displayed. Then, the intermediate value d12 disappears and the intermediate value d13 is displayed. Subsequently, the intermediate value d13 disappears and the second measurement value d2 is displayed. With respect to the second measurement value d2 onward, intermediate values are similarly generated and successively displayed in a similar order.

The intermediate values can be generated, based on the following formula (1).

$$\left(\sqrt[5]{\frac{P(N)}{P(N+1)}}\right)^m \times P(N+1) \tag{1}$$

In the formula (1), P(N) is the N-th measurement value, P(N+1) is the (N+1)th measurement value, and m is the number of divisions. Hear, N is an integer of 1 or more. m is an integer of 2 or more.

The number of intermediate values generated based on the formula (1) is m−1 between the N-th measurement value and the (N+1)th measurement value when the period between the N-th time and the (N+1)th time is divided into m parts.

In the first display screen 110, the first measurement value d1, the second measurement value d2, and also the intermediate values d11, d12, d13 are successively displayed. Therefore, the movement between the first measurement value d1 and the second measurement value d2 is complemented and the change in the measurement value KX is displayed smoothly.

When the measurement values KX, KY, KZ and the composite value Co are successively displayed in time series in the first display screen 110 in the data playback screen, the user can smoothly visually recognize a plurality of movements and therefore can easily and intuitively visually recognize and analyze a complicated vibration state or vibration change.

Also, since the movements of the measurement values KX, KY, KZ are visible, an abnormal value in each direction that cannot be found simply based on the composite value and the peak value, or a value showing a sign of a device malfunction can be found. Therefore, prevention measures can be taken before the occurrence of a device malfunction or product abnormality.

Even when a small abnormal value occurs, the behavior can be easily understood based on successive movements and therefore the abnormality can be found easily.

Also, in the data playback screen, inputting an arbitrary numeric value in the speed input section 113 shown in FIG. 2 enables setting of the display speed of the measurement values KX, KY, KZ and the composite value Co successively displayed in the first display screen 110, to an arbitrary speed.

As the display speed is set to an arbitrary speed, the values can be checked at a display speed that is suitable for the purpose. For example, a value acquired over a long time can be checked in a short time at an increased display speed and the check work can thus be performed efficiently. Also, a peculiar value can be carefully checked over a sufficient time at a decreased display speed. Therefore, a change with time in the vibration velocity at each frequency is understood and analyzed more easily.

Inputting an arbitrary numeric value in the number-of-divisions input section 114 enables setting of the number of divisions to generate intermediate values displayed in the first display screen 110, to an arbitrary numeric value. For example, in the case of the measurement value KX shown in FIG. 5, when 4 is inputted in the number-of-divisions input section 114, the number of divisions to generate intermediate values is set to 4 and therefore three intermediate values are generated. While FIG. 5 shows an example where the period between the first second and the second second is divided into four parts to generate the three intermediate values d11, d12, d13, the number of divisions is not limited to four. The number of divisions may be three or fewer or may be five or more.

As the number of divisions to generate intermediate values is set to an arbitrary numeric value, the movement of change with time in the vibration velocity can be checked and adjusted more easily. For example, when a long interval between measurement times results in a large change in value, increasing the number of divisions enables the value to be complemented with intermediate values and makes it easier to grasp the overall movement of the vibration velocity. As the number of divisions becomes larger, the movement of the value displayed in the first display screen 110 becomes smoother and the change with time in the vibration velocity at each frequency becomes easier to understand and analyze.

In the data playback screen shown in FIG. 2, when the playback button 118 is selected, the maximum peak value of the vibration velocity is displayed along a time axis in the second display screen 111 as a second two-dimensional display showing time and the maximum value of the spectral intensity of vibration, and the frequency value corresponding to the maximum peak value is displayed along a time axis in the third display screen 112 as a third two-dimensional display showing time and the frequency corresponding to the maximum value of the spectral intensity of vibration. Therefore, the change with time in the maximum peak value of the vibration velocity can be checked and the frequency corresponding to the maximum peak value becomes easier to grasp and analyze. For example, it is easier to grasp when the vibration has a time-related trend, or the like.

When a predetermined time is designated in the time input sections 115a, 115b, 115c, the display automatically played back by selecting the playback button 118 stops and the value of the predetermined time is displayed in the first display screen 110, the second display screen 111, and the third display screen 112.

The time input section 115a is a seekbar. The time input section 115b is a thumb on the seekbar. The time input section 115c is an increment-decrement button.

To designate a predetermined time in the time input sections 115a, 115b, 115c, the time indicated by the time input section 115b is changed by moving the time input section 115b on the time input section 115a representing the entire measurement time. Alternatively, the time indicated by the time input section 115b is changed by increasing or decreasing the numeric value with the increment-decrement button of the time input section 115c. Thus, the maximum peak value of the vibration velocity corresponding to the time indicated by the time input section 115b is displayed in the second display screen 111. The frequency corresponding to the maximum peak value is displayed in the third display screen 112. The measurement values KX, KY, KZ and the composite value Co are displayed in the first display screen 110.

Figure 6:
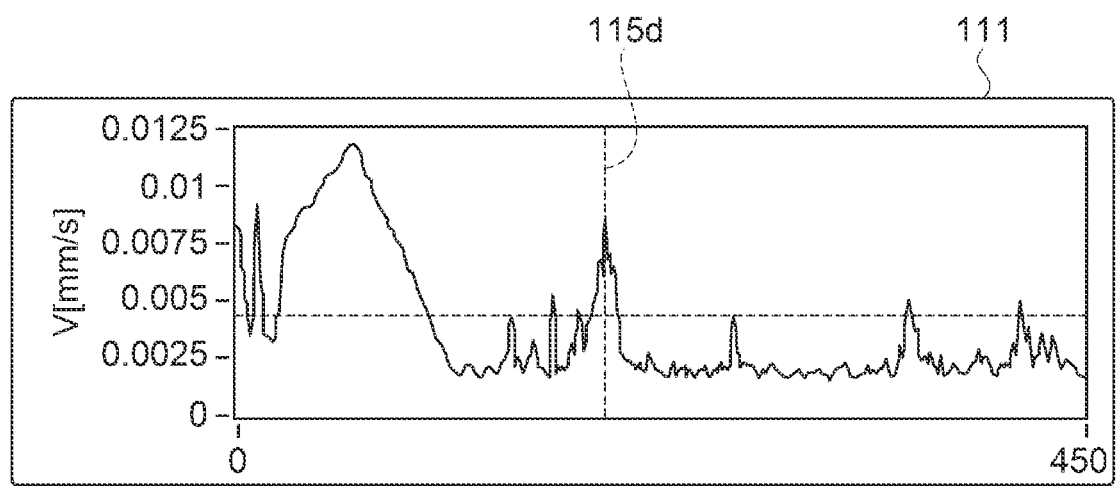
FIG. 6 shows a second display screen where a peak value of spectral intensity is displayed.
Figure 7:
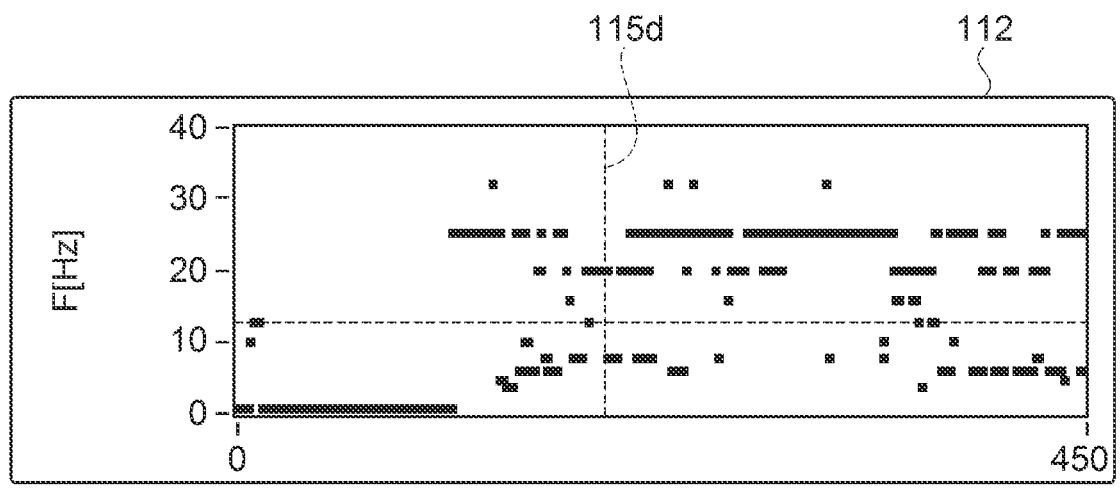
FIG. 7 shows a third display screen were a frequency corresponding to the peak value of spectral intensity is displayed.

In the time input sections 115a, 115b, 115c, a part to be checked can be designated from the display. Therefore, a line 115d can be adjusted to coincide with an arbitrary time in the graph of the vibration velocity in the second display screen 111 as shown in FIG. 6. Thus, the vibration state corresponding to the measurement values KZ, KY, KZ and the composite value Co and the time of occurrence corresponding to the time TD displayed in the first display screen 110 can be checked. Also, the line 115d can be adjusted to coincide with an arbitrary time in the third display screen 112 as shown in FIG. 7. Thus, the vibration state corresponding to the measurement values KZ, KY, KZ and the composite value Co and the time of occurrence corresponding to the time TD displayed in the first display screen 110 can be checked.

In the time input sections 115a, 115b, 115c, a value corresponding to a certain time point can be sliced out and checked. Therefore, the change with time in the vibration can be grasped and analyzed more in detail.

The inertial measurement system 1 not only achieves the foregoing effects but also enables predictive maintenance of the device by continuously measuring vibrations of the device. The inertial measurement system 1 makes it easier to find an abnormal value that does not appear in the maximum peak value and therefore to find an abnormality in advance and lead to stable operation. Also, since suitable maintenance for the state of the device can be performed, excessive maintenance can be reduced.

In the inertial measurement system 1, measurement information by the inertial measurement device 20 can be saved and played back at an arbitrary speed. Therefore, the user can check the vibration state of the device in a short time without waiting at the device to monitor the device. This improves the efficiency of work and enables efficient grasping and analysis of information.

In the embodiment, the personal computer (PC) 10 is used as a display device. However, the display device is not limited to the PC. A tablet terminal, smartphone or the like can be used as a display device by having PC viewer software installed therein and receiving measurement information from the inertial measurement device 20 via a communication interface.

What is claimed is:

1. An inertial measurement system comprising:
three axes orthogonal to each other being defined as an X axis, a Y axis, and a Z axis;
a first acceleration sensor configured to detect first time series acceleration along the X axis;
a second acceleration sensor configured to detect second time series acceleration along the Y axis;
a third acceleration sensor configured to detect third time series acceleration along the Z axis;
a display having a screen, the screen having first, second, and third display areas;
a memory configured to store a program; and
a processor configured to execute the program so as to:
receive in instruction input via an input interface displayed at the first display area;
calculate first frequencies and first spectral intensities of first vibrations at the first frequencies based on the detected first time series acceleration;
calculate first relationship values between the calculated first frequencies and the calculated first spectral intensities;
calculate second frequencies and second spectral intensities of second vibrations at the second frequencies based on the detected second time series acceleration;
calculate second relationship values between the calculated second frequencies and the calculated second spectral intensities;
calculate third frequencies and third spectral intensities of third vibrations at the third frequencies based on the detected third time series acceleration;
calculate third relationship values between the calculated third frequencies and the calculated third spectral intensities;
calculate combined frequencies and combined spectral intensities of combined vibrations at the combined frequencies based on the detected first, second, and third time series accelerations;
calculate combined relationship values between the calculated combined frequencies and the calculated combined spectral intensities;
display a time series peak value history relating to peak information of at least one of the first, second, third, and combined spectral intensities, or the first, second, third, and combined frequencies at the second display area;
with respect to each of the first, second, third, and combined relationship values;
identify an N-th value corresponding to an N-th time of the time series, wherein the N is a first positive integer;
identify an (N+1)-th values corresponding to an (N+1)-th time of the time series; and
identify (m−1) intermediate values between the N-th value and the (N+1)-th value by dividing a period between the N-th time and the (N+1)-th time with m, wherein the m is a second positive integer;
display, in a first display mode selected by the processor based on the instruction input, at least one relationship value of the first relationship values, the second relationship values and the third relationship values, and the combined relationship values at the third display area at the same time; and
display, in a second display mode selected by the processor based on the instruction input, successively the N-th value, the m−1 intermediate values, and the (N+1)-th value at the third display area in time series.

2. The inertial measurement system according to claim 1, wherein
the processor is configured to display a vibration criterion at the third display area as superimposed on the at least one relationship values and the combined relationship values.

3. The inertial measurement system according to claim 1, wherein
the third display area is shown as a tripartite graph.

4. The inertial measurement system according to claim 1, wherein
the processor is configured to receive the instruction input, via the first display area, relation to an arbitrary value of a display speed for successively displaying the N-th value, the m−1 intermediate values, and the (N+1)-th value at the third display area.

5. The inertial measurement system according to claim 1, wherein
the processor is configured to receive the instruction input, via the first display area, relating to an arbitrary value of the m.

6. The inertial measurement system according to claim 1, wherein
the processor is configured to receive the instruction input, via the first display area, relating to a predetermined time within a period of time with respect to the time series and display the predetermined time at the third display area.

7. The inertial measurement system according to claim 1, wherein
each of the first, second, and third acceleration sensors is a quartz crystal acceleration sensor.

* * * * *